United States Patent
Gu et al.

(10) Patent No.: US 10,691,029 B2
(45) Date of Patent: Jun. 23, 2020

(54) SUBSTRATE MEASUREMENT RECIPE CONFIGURATION TO IMPROVE DEVICE MATCHING

(71) Applicant: ASML NETHERLANDS B.V., Veldhoven (NL)

(72) Inventors: Ning Gu, San Jose, CA (US); Daimian Wang, Fremont, CA (US); Jen-Shiang Wang, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/305,913

(22) PCT Filed: Jun. 1, 2017

(86) PCT No.: PCT/EP2017/063383
§ 371 (c)(1),
(2) Date: Nov. 30, 2018

(87) PCT Pub. No.: WO2017/215944
PCT Pub. Date: Dec. 21, 2017

(65) Prior Publication Data
US 2019/0250519 A1    Aug. 15, 2019

Related U.S. Application Data

(60) Provisional application No. 62/350,525, filed on Jun. 15, 2016.

(51) Int. Cl.
*G03F 7/00* (2006.01)
*G06F 30/30* (2020.01)
*G03F 7/20* (2006.01)

(52) U.S. Cl.
CPC .......... *G03F 7/70616* (2013.01); *G03F 7/705* (2013.01); *G03F 7/70633* (2013.01); *G06F 30/30* (2020.01)

(58) Field of Classification Search
CPC .. G03F 7/70616; G03F 7/705; G03F 7/70633; G06F 17/5045; G06F 30/30
(Continued)

(56) References Cited

U.S. PATENT DOCUMENTS

| 6,961,116 B2 | 11/2005 | Den Boef et al. |
| 2006/0066855 A1 | 3/2006 | Den Boef et al. |

(Continued)

FOREIGN PATENT DOCUMENTS

| WO | 2009078708 | 6/2009 |
| WO | 2009106279 | 9/2009 |

OTHER PUBLICATIONS

International Search Report and Written Opinion issued in corresponding PCT Patent Application No. PCT/EP2017/063383, dated Oct. 13, 2017.

(Continued)

*Primary Examiner* — Phallaka Kik
(74) *Attorney, Agent, or Firm* — Pillsbury Winthrop Shaw Pittman LLP

(57) ABSTRACT

A method including computing a multi-variable cost function, the multi-variable cost function representing a metric characterizing a degree of matching between a result when measuring a metrology target structure using a substrate measurement recipe and a behavior of a pattern of a functional device, the metric being a function of a plurality of design variables including a parameter of the metrology target structure, and adjusting the design variables and computing the cost function with the adjusted design variables, until a certain termination condition is satisfied.

20 Claims, 14 Drawing Sheets

(58) Field of Classification Search
USPC ........... 716/55, 54, 111, 53; 703/15; 700/98, 700/110, 120, 121; 702/117
See application file for complete search history.

(56) References Cited

U.S. PATENT DOCUMENTS

| | | |
|---|---|---|
| 2009/0157360 A1 | 6/2009 | Ye et al. |
| 2011/0027704 A1 | 2/2011 | Cramer et al. |
| 2011/0043791 A1 | 2/2011 | Smilde et al. |
| 2012/0124529 A1* | 5/2012 | Feng .................. G02B 19/0095 716/54 |
| 2012/0242970 A1 | 9/2012 | Smilde et al. |
| 2017/0147722 A1* | 5/2017 | Greenwood ............ G06F 17/00 |

OTHER PUBLICATIONS

Nam, Young Sun, et al.: "Overlay Improvement Methods with Diffraction Based Overlay and Integrated Metrology", Proc. of SPIE, vol. 9426, 2015.

Kim, Shinyoung, et al.: "OPC optimization techniques for enabling the reduction of mismatch between overlay metrology and the device pattern cell", Proc. of SPIE, vol. 9778, Mar. 24, 2016.

* cited by examiner

SUBSTRATE MEASUREMENT RECIPE CONFIGURATION TO IMPROVE DEVICE MATCHING

CROSS-REFERENCE TO RELATED APPLICATIONS

This application is the U.S. national phase entry of PCT patent application no. PCT/EP2017/063383, which was filed on Jun. 1, 2017, which claims the benefit of priority of U.S. provisional application No. 62/350,525, which was filed on Jun. 15, 2016, and which is incorporated herein in its entirety by reference.

TECHNICAL FIELD

The description herein relates to metrology of a product of a patterning process.

BACKGROUND

A lithography apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithography apparatus, one target portion at a time. In one type of lithography apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithography apparatus will have a reduction ratio M (e.g., 4), the speed F at which the substrate is moved will be 1/M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

In order to monitor one or more steps of the patterning process, the patterned substrate is inspected and one or more parameters of the patterned substrate are measured. The one or more parameters may include, for example, the overlay error between successive layers formed in or on the patterned substrate and/or critical dimension (e.g., linewidth) of developed photosensitive resist. This measurement may be performed on a target of the product substrate itself and/or on a dedicated metrology target provided on the substrate. There are various techniques for making measurements of the microscopic structures formed in lithography processes, including the use of a scanning electron microscope and/or various specialized tools.

A fast and non-invasive form of specialized inspection tool is a scatterometer in which a beam of radiation is directed onto a target on a substrate and properties of the scattered and/or reflected (or more generally redirected) beam are measured. By comparing one or more properties of the beam before and after it has been redirected from the substrate, one or more properties of the substrate (e.g., of one or more of its layers and one or more structure formed in the one or more layers) can be determined. Two main types of scatterometer are known. A spectroscopic scatterometer directs a broadband radiation beam onto the substrate and measures the spectrum (intensity as a function of wavelength) of the radiation redirected into a particular narrow angular range. An angularly resolved scatterometer uses a monochromatic radiation beam and measures the intensity of the redirected radiation as a function of angle.

A particular application of scatterometry is in the measurement of feature asymmetry within a periodic target. This can be used as a measure of overlay error, for example, but other applications are also known. In an angle resolved scatterometer, asymmetry can be measured by comparing opposite parts of the diffraction spectrum (for example, comparing the −1st and +1st orders in the diffraction spectrum of a periodic grating). This can be done simply in angle-resolved scatterometry, as is described for example in U.S. patent application publication US2006-066855, which is incorporated herein in its entirety by reference.

BRIEF SUMMARY

Disclosed herein is a method comprising: computing, by a hardware computer system, a multi-variable cost function, the multi-variable cost function representing a metric characterizing a degree of matching between a result when measuring a metrology target structure using a substrate measurement recipe and a behavior of a pattern of a functional device, the metric being a function of a plurality of design variables comprising a parameter of the metrology target structure; and adjusting one or more of the design variables and computing the cost function with the adjusted one or more design variables, until a certain termination condition is satisfied.

According to an embodiment, the result when measuring the metrology target structure using the substrate measurement recipe comprises overlay, alignment or focus.

According to an embodiment, computing the multi-variable cost function comprises simulating the result of measuring the metrology target structure using the substrate measurement recipe.

According to an embodiment, simulating the result comprises determining, from a parameter of the substrate measurement recipe, a characteristic of radiation used to measure the metrology target structure using the substrate measurement recipe.

According to an embodiment, simulating the result comprises determining, from the parameter of the metrology target structure, an interaction between the radiation and the metrology target structure.

According to an embodiment, the metric is a difference between the result and the behavior.

According to an embodiment, the cost function further represents a performance of the measurement of the metrology target structure when using the substrate measurement recipe.

According to an embodiment, the performance comprises detectability of the metrology target structure associated with the substrate measurement recipe, printability of a measurement target structure associated with the substrate measurement recipe, sensitivity of measurements made using the substrate measurement recipe, stability of measurements made using the substrate measurement recipe, or a combination selected therefrom.

According to an embodiment, one or more of the design variables are under a constraint that the performance either crosses or does not cross, a threshold.

According to an embodiment, the termination condition comprises one or more selected from: minimization of the cost function; maximization of the cost function; reaching a certain number of iterations; reaching a value of the cost function equal to or beyond a certain threshold value; reaching a certain computation time; and/or reaching a value of the cost function within an acceptable error limit.

According to an embodiment, the design variables are adjusted by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

Also disclosed herein is a computer program product comprising a computer non-transitory readable medium having instructions recorded thereon, the instructions when executed by a computer implementing a method herein.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

Figure 1:
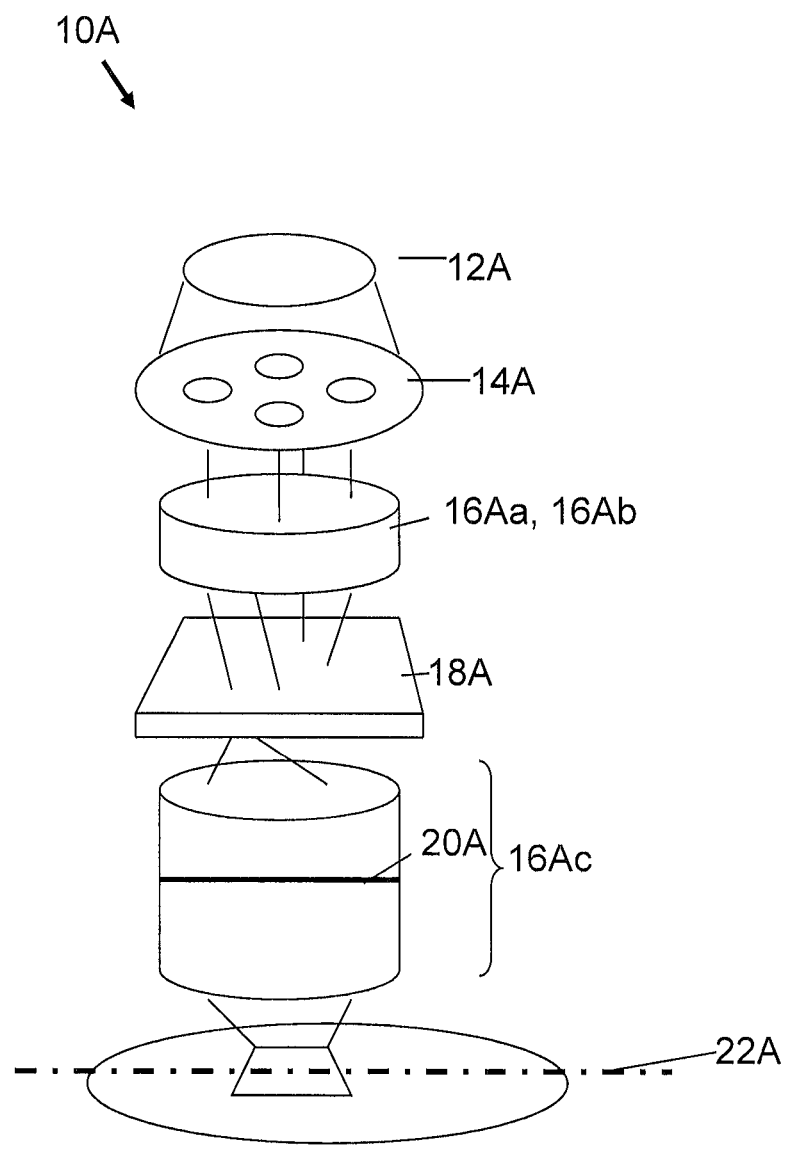
FIG. 1 is a block diagram of various subsystems of a lithography system.

As a brief introduction, FIG. 1 illustrates an exemplary lithography apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithography apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In a lithography apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The latent resist image (RI) (or simply "latent image") can be defined as a spatial distribution of a characteristic (e.g., solubility or thickness) of the resist in the resist layer, before the resist layer is developed. A developed image of the latent image is a spatial distribution of the resist in the resist layer after the resist layer having the latent image has been developed. A resist model can be used to calculate the resist image (latent or developed) from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithography apparatus (e.g., properties of the source, the patterning device and the projection optics) dictate the aerial image. Since the patterning device used in the lithography apparatus can be changed, it is desirable to separate the optical properties of the patterning device from the optical properties of the rest of the lithography apparatus including at least the source and the projection optics.

Figure 2:
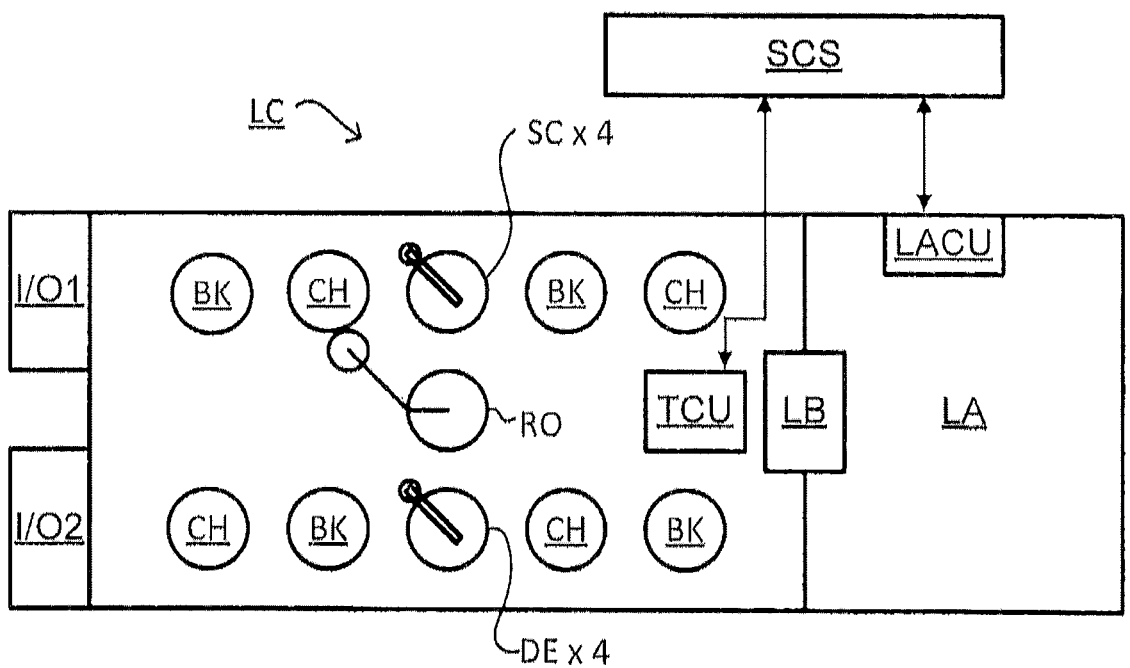
FIG. 2 schematically depicts an embodiment of a lithographic cell or cluster.

As shown in FIG. 2, the lithography apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithography apparatus. These devices, which are often collectively referred to as the track, are under the control of a track control unit TCU which is itself controlled by the supervisory control system SCS, which also controls the lithography apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc.

In a semiconductor device fabrication process (e.g., lithography process), a substrate may be subjected to various types of measurement during or after the process. The measurement may determine whether a particular substrate is defective, may establish adjustments to the process and apparatuses used in the process (e.g., aligning two layers on the substrate or aligning the mask to the substrate), may measure the performance of the process and the apparatuses, or may be for other purposes. Examples of substrate measurement include optical imaging (e.g., optical microscope), non-imaging optical measurement (e.g., measurement based on diffraction such as ASML YieldStar, ASML SMASH GridAlign), mechanical measurement (e.g., profiling using a stylus, atomic force microscopy (AFM)), non-optical imaging (e.g., scanning electron microscopy (SEM)). The SMASH (SMart Alignment Sensor Hybrid) system, as described in U.S. Pat. No. 6,961,116, which is incorporate by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

To enable measurement, a substrate measurement recipe can be used that specifies one or more parameters of the measurement using the measurement system. In an embodiment, the term "substrate measurement recipe" includes one or more parameters of the measurement itself, one or more parameters of a pattern measured, or both. For example, if the measurement used in a substrate measurement recipe is a diffraction-based optical measurement, one or more parameters of the measurement itself may include a wavelength of measurement radiation, a polarization of measurement radiation, an incident angle relative to the substrate of measurement radiation, and/or the relative orientation relative to a pattern on the substrate of diffracted measurement radiation. The one or more parameters of the measurement itself may include one or more parameters of the metrology apparatus used in the measurement. A pattern measured may be a pattern whose diffraction is measured. The pattern measured may be a pattern specially designed or selected for measurement purposes (also known as a "target" or "target structure"). Multiple copies of a target may be placed on many places on a substrate. A substrate measurement recipe may be used to align a layer of a pattern being imaged against an existing pattern on a substrate. A substrate measurement recipe may be used to align the patterning device to the substrate, by measuring a relative position of the substrate. If the substrate measurement recipe comprises one or more parameters of a pattern measured, the one or more parameters of the pattern measured may include an identification of the pattern (e.g., distinguishing a pattern being from another pattern), a shape at least part of the pattern, orientation of at least part of the pattern, and/or size of at least part of the pattern.

A substrate measurement recipe may be expressed in a mathematical form: $(r_1, r_2, r_3, r_n; t_1, t_2, t_3, \ldots t_m)$, where $r_i$ are one or more parameters of the measurement and $t_1$ are one or more parameters of one or more patterns measured. As will be appreciated, n and m can be 1. Further, the substrate measurement recipe does not need to have both one or more parameters of the measurement and one or more parameters of one or more patterns measured; it can have just one or more parameters of the measurement.

Figure 4:
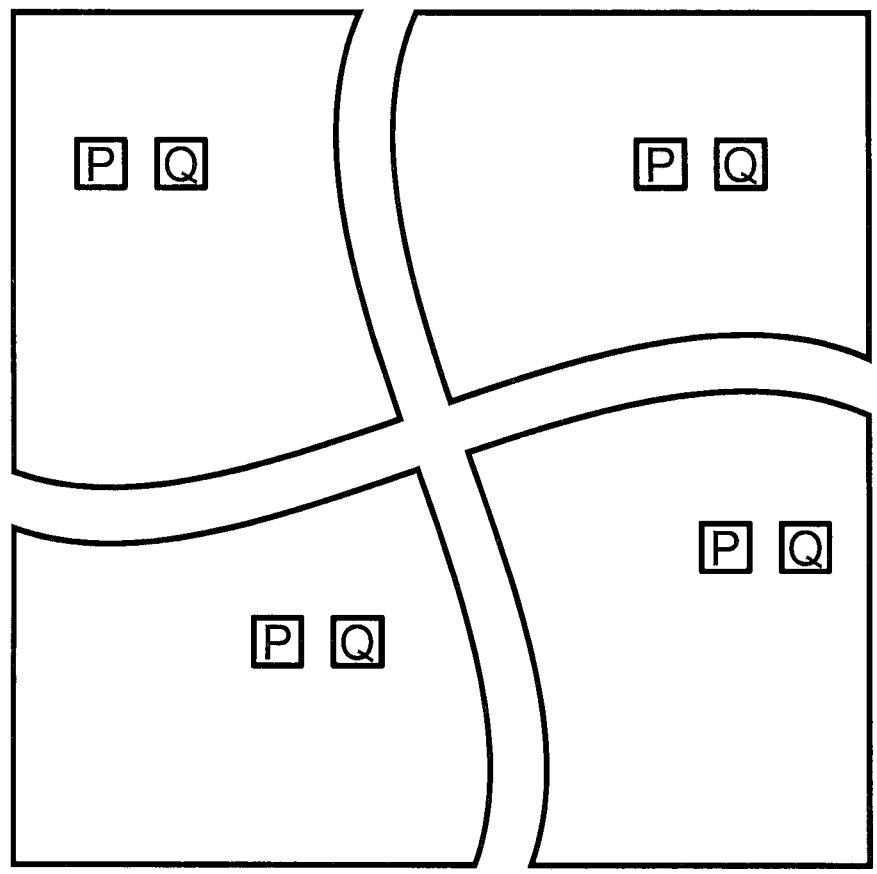
FIG. 4 schematically shows a substrate with two distinct targets P and Q, where copies of each are placed in four different areas of the substrate.

FIG. 4 schematically shows a substrate with two distinct targets P and Q, where copies of each are placed in four different areas of the substrate. The targets may include gratings, e.g., of mutually perpendicular directions. The target may include locations on a pattern where a measurement can detect displacement of an edge of the pattern or a dimension of the pattern. The substrate of FIG. 4 may be subjected to measurement using two substrate measurement recipes A and B. Substrate measurement recipes A and B at least differ on the target measured (e.g., A measures target P and B measures target Q). Substrate measurement recipes A and B may also differ on the parameters of their measurement. Substrate measurement recipes A and B may not even be based on the same measurement technique. For example recipe A may be based on SEM measurement and recipe B may be based on AFM measurement.

A target may comprise a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, when the target can be positioned in among product features, rather than in a scribe lane, the size of a target may be reduced, e.g., to 20 μm by 20 μm or less, or to 10 μm by 10 μm or less. In this situation, the periodic structure layout may be made smaller than the measurement spot (i.e., the periodic structure layout is overfilled). Such a target can be measured using dark field scatterometry in which the zeroth order of diffraction (corresponding to a specular reflection) is blocked, and only higher orders are processed. Examples of dark field metrology can be found in PCT patent application publication nos. WO 2009/078708 and WO 2009/106279, which are hereby incorporated in their entirety by reference. Further developments of the technique have been described in U.S. patent application publications US2011/0027704, US2011/0043791 and US2012/0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 3A:
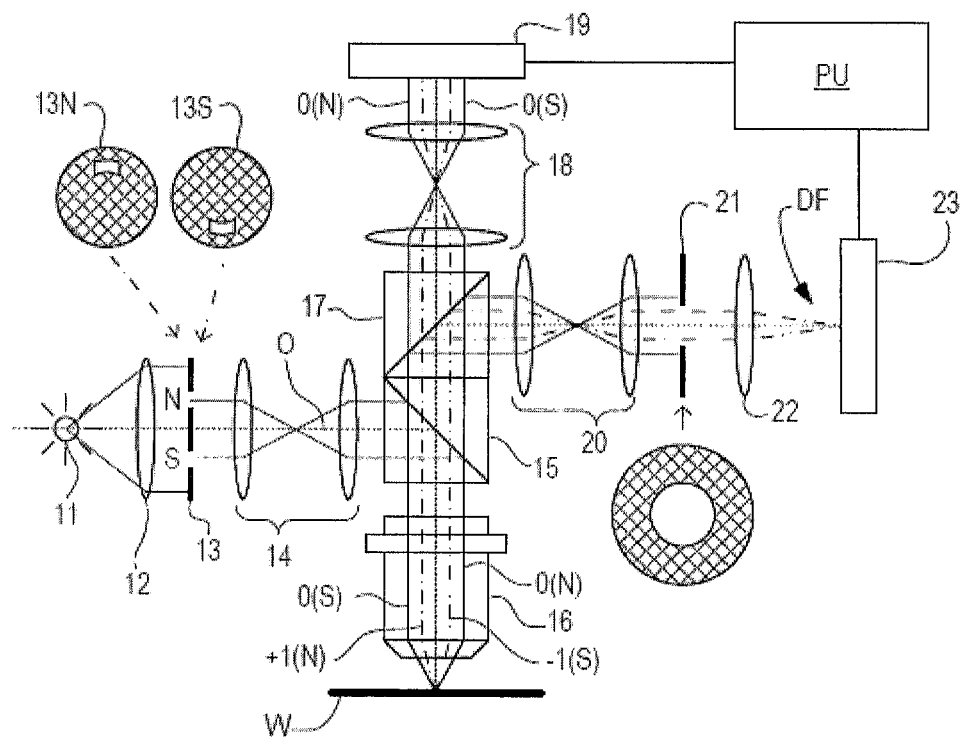
FIG. 3A is schematic diagram of a measurement apparatus for use in measuring targets using a first pair of illumination apertures providing certain illumination modes.

A metrology apparatus is shown in FIG. 3A. A target T (comprising a periodic structure such as a grating) and diffracted rays are illustrated in more detail in FIG. 3B. The metrology apparatus may be a stand-alone device or incorporated in either the lithography apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. In an embodiment, the radiation is ultraviolet radiation, visible radiation or x-ray radiation. These lenses are arranged in a double sequence of a 4F arrangement. A different lens arrangement can be used, provided that it still provides a substrate image onto a detector.

The lens arrangement may allow for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals. The parameters of the measurement of a substrate measurement recipe may include the intensity distribution at the pupil plane. A target may be a part of multiple substrate measurement recipes that differ in the intensity distribution at the pupil plane.

Figure 3B:
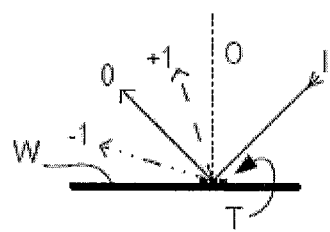
FIG. 3B is a schematic detail of a diffraction spectrum of a target for a given direction of illumination.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIG. 3A and FIG. 3B are shown somewhat off axis, purely to enable them to be more easily distinguished in the diagram.

At least the 0 and +1 orders diffracted by the target on substrate W are collected by objective lens 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1$^{st}$ and the +1$^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

Figure 3C:
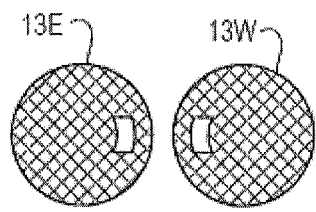
FIG. 3C is a schematic illustration of a second pair of illumination apertures providing further illumination modes in using a measurement apparatus for diffraction based overlay measurements.
Figure 3D:
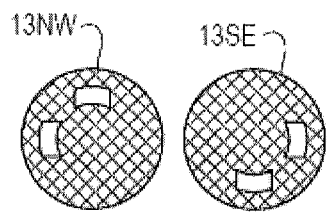
FIG. 3D is a schematic illustration of a third pair of illumination apertures combining the first and second pairs of apertures providing further illumination modes in using a measurement apparatus for diffraction based overlay measurements.

The particular forms of aperture plate 13 and stop 21 shown in FIG. 3C and FIG. 3D are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIG. 3C and FIG. 3D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3D, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 3E:
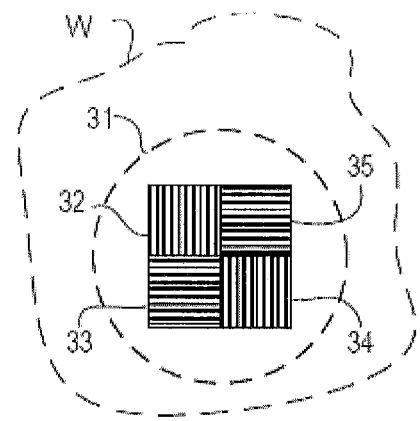
FIG. 3E depicts a form of multiple periodic structure (e.g., multiple grating) target and an outline of a measurement spot on a substrate.

FIG. 3E depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Figure 3F:
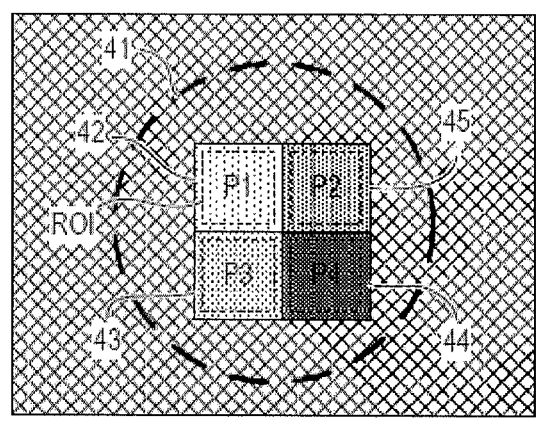
FIG. 3F depicts an image of the target of FIG. 3E obtained in the apparatus of FIG. 3A.

FIG. 3F shows an example of an image that may be formed on and detected by the sensor 23, using the target of FIG. 3E in the apparatus of FIG. 3A, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

The result (e.g., overlay, alignment, focus) of using a substrate measurement recipe to measure a target may be simulated. In the simulation, one or more parameters of the measurement are determined from the parameters $r_1$ of the substrate measurement recipe. For example, the one or more parameters of the measurement can include one or more characteristics/parameters of the radiation used to measure the target used with the substrate measurement recipe, which can include wavelength, polarization, intensity distribution, etc. For example, the one or more parameters of the measurement can include one or more characteristics/parameters of the detection of radiation used to measure the target used with the substrate measurement recipe, which can include detector sensitivity, numerical aperture, etc. Further, in the simulation, one or more of the characteristics/parameters of the target are used (e.g., provided by, or determined from, parameters $t_j$ of the substrate measurement recipe). For example, the one or more characteristics/parameters of the target can include one or more geometric characteristics (e.g., pitch of features of a periodic structure of the target, CD of a feature of a periodic structure of the target (e.g., the widths of the exposed portions and/or unexposed portions), segmentation of individual features of a periodic structure of the pattern, shape of at least part of a periodic structure, length of a periodic structure or of a feature of the periodic structure, etc.) and/or one or more materials properties (e.g., refractive index of a layer of the target, extinction coefficient of a layer of the target, etc.). The interaction between the radiation and the target can be determined from the parameters $r_i$ of the substrate measurement recipe and the one or more parameters of the target. The result of using the target and the associated substrate measurement recipe can be determined from the interaction.

The result of using a substrate measurement recipe with a target should match the behavior of one or more patterns of the functional device on the substrate (e.g., a pattern in the functional device or a pattern used to form the functional device). For example, if a pattern of the functional device has an overlay error relative to a structure below, the result using a target with a substrate measurement recipe should show a similar overlay error; if the pattern of the functional device has a focus error, the result of using the substrate measurement recipe with a target should show a similar focus error.

A target and/or substrate measurement recipe can be optimized to make the result thereof match the behavior of one or more patterns of a functional device on the substrate. Some or all of the parameters of the target and/or substrate measurement recipe may be adjusted in the optimization. For example, one or more parameters of the target and/or one or more parameters of the measurement may be adjusted. The optimization may use a cost function that represents a metric characterizing the degree of matching between the result (e.g., overlay, alignment, focus) of using a particular target design in combination with a substrate measurement recipe and the behavior of one or more patterns of one or more functional devices. For example, the behavior of the one or more patterns of the functional device may be simulated using any suitable method or experimentally determined. As noted above, the result of measuring a target (of a particular design) using a substrate measurement recipe may be simulated. Thus, in an embodiment, the metric may be a difference between the result and the behavior. In the optimization of the target and/or substrate measurement recipe, the behavior of the one or more patterns of the one or more functional devices remains constant. The cost function may further represent or be constrained by the performance (e.g., detectability of the target, printability of the target, measurement sensitivity of the target, stability of measurement) of the target in combination with an associated substrate measurement recipe. Stability is how much the result of using the substrate measurement recipe to make a measurement with a target varies under a perturbation.

The term "optimizing" and "optimization" as used herein refers to or means adjusting an apparatus and/or process of the patterning process, which may include adjusting a lithography process or apparatus, or adjusting the metrology process or apparatus (e.g., the target, measurement tool, etc.), such that a figure of merit has a more desirable value, such as patterning and/or device fabrication results and/or processes (e.g., of lithography) have one or more desirable characteristics, projection of a design layout on a substrate being more accurate, a process window being larger, etc. Thus, optimizing and optimization refers to or means a process that identifies one or more values for one or more design variables that provide an improvement, e.g. a local optimum, in a figure of merit, compared to an initial set of values of the design variables. "Optimum" and other related terms should be construed accordingly. In an embodiment, optimization steps can be applied iteratively to provide further improvements in one or more figures of merit.

In an optimization of process or apparatus, a figure of merit can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics of the process and/or system with respect to the intended values (e.g., ideal values) of these characteristics; the cost function can also be the maximum of these deviations (i.e., worst deviation). The design variables can be confined to finite ranges and/or be interdependent due to practicalities of implementations of the process and/or system. In the case of a patterning process, the constraints are often associated with physical properties and characteristics of the hardware and/or patterning step, such as tunable ranges of hardware and/or patterning device manufacturability design rules.

Figure 5:
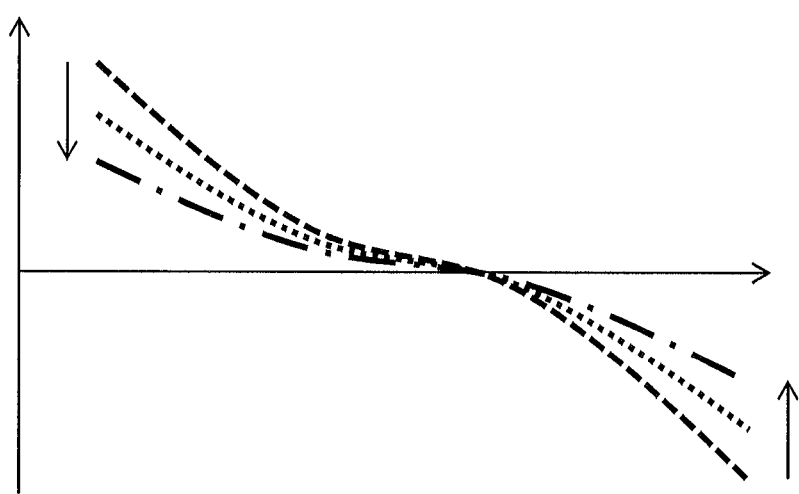
FIG. 5 shows an example of the optimization where the metric characterizing the degree of matching between the result (e.g., overlay, alignment, focus) of a substrate measurement recipe and the behavior of the patterns of functional devices is the difference (vertical axis) between the overlay value obtained from the substrate measurement recipe and the overlay value of the patterns of the functional devices, at different slit positions (horizontal axis).

FIG. 5 shows an example of the optimization where the metric characterizing the degree of matching between the result (e.g., overlay, alignment, focus) of a target measured using a substrate measurement recipe and the behavior of a pattern of a functional device is the difference (vertical axis) between the overlay value obtained measuring a target using the substrate measurement recipe and the overlay value of the pattern of the functional device, at different slit positions (horizontal axis). The vertical arrows show the progression of the change in the target design and/or substrate measurement recipe during the optimization. The metric approaches zero, which means that the result of measuring the target in combination with the substrate measurement recipe matches the behavior of the pattern of the functional device better and better in the optimization process.

Physically, the (mis)matching (e.g., overlay shift) is mostly induced by optical aberrations when printing the device and the target on the substrate. How the target is measured (e.g., the target's detection by a measurement apparatus) will not affect how much the target is shifted. On the other hand, the detectability of the target is determined by the interaction between upper and lower periodic structures of the target (for an overlay target) or to the interaction between the target periodic structure and a sensor (for an alignment target). So, a shift introduced by aberrations usually has little or no impact on the detectability if the target is in the region of good detectability. So, these two effects are kind of independent of each other, except that both will be influenced by how the target's characteristics in terms of geometry, materials property, etc. So, changing a target characteristic could have a large impact to one metric but have little impact to another. So, in an embodiment, having consideration of these properties, an optimizer can find a solution.

As an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$, such as a metric characterizing the degree of matching between the result (e.g., overlay, alignment, focus) of a particular target design as measured using a particular substrate measurement recipe and the behavior of one or more patterns of one or more functional devices, for a set of values of the design variables of $(z_1, z_2, \ldots, z_N)$. $f_p(z_1, z_2, \ldots, z_N)$ can be a metric characterizing the performance (e.g., detectability, printability, sensitivity, stability) of a particular target design in combination with an associated substrate measurement recipe. $f_p(z_1, z_2, \ldots, z_N)$ can be a metric characterizing the detectability of the particular target design with its associated substrate measurement recipe, namely a measure of the ability of the measurement apparatus and process to detect and measure the particular target design with its associated substrate measurement recipe. $f_p(z_1, z_2, \ldots, z_N)$ can be a metric characterizing the stability of measurement using the particular target design with its associated substrate measurement recipe, namely how much the result of the measurement of the particular target design with its associated substrate measurement recipe varies under perturbation. So, in an embodiment, $CF(z_1, z_2, \ldots, z_N)$ is a combination of a $f_p(z_1, z_2, \ldots, z_N)$ characterizing a degree of matching between the result (e.g., overlay, alignment, focus) of a particular target design as measured using a particular substrate measurement recipe and the behavior of one or more patterns of one or more functional devices and performance a $f_p(z_1, z_2, \ldots, z_N)$ characterizing the detectability of the particular target design with its associated substrate measurement recipe. $w_p$ is a weight constant associated with $f_p(z_1, z_2, \ldots, z_N)$ and of course, could have different values for different $f_p(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

Thus, in an embodiment, the cost function can include both performance indicators of device pattern matching and target detectability. In an embodiment, the cost function can be the same, or similar in form to, the following:

Cost Function = (Eq. 2)

$$\sqrt{(W1 * PI_{device\ matching})^2 + (W2 * PI_{detectability})^2} +$$

Penalty function $(PI_{device\ matching}, PI_{detectability})$ wherein $PI_{device\ matching}$ is the performance indicator for device pattern matching, $PI_{detectability}$ is the performance indicator for target detectability, and W1 and W2 are weighting coefficients. With this format, both device pattern matching and target detectability are co-optimized mathematically. If better device pattern matching is desired, then W1 would be larger than W2.

So, in an embodiment, the cost function for $PI_{device\ matching}$ is a function of optical aberration components. In an embodiment, the optical aberration components can be denominated in Zernike coefficients (Z1, Z2, ..., Z20, ...). So, in an embodiment, the cost function can comprises $(a \cdot (b \cdot (Z10+c) - d \cdot (Z19+e) + f(Z26+g)))^2$, wherein a, b, c, d, e, f and g are various constants. As will be appreciated, different Zernike coefficient could be used.

So, in an embodiment, the cost function for $PI_{detectability}$ comprises $\sqrt{TC^2 + 1/SS^2}$ wherein TC is target coefficient and SS is stack sensitivity.

In one embodiment, the design variables $(z_1, z_2, \ldots, z_N)$ comprise one or more characteristics/parameters of the target. For example, the design variables can include one or more geometric characteristics (e.g., pitch of features of a periodic structure of the target, CD of a feature of a periodic structure of the target (e.g., the widths of the exposed portions and/or unexposed portions), segmentation of individual features of a periodic structure of the pattern, shape of at least part of a periodic structure, length of a periodic structure or of a feature of the periodic structure, etc.) and/or one or more materials properties (e.g., refractive index of a layer of the target, extinction coefficient of a layer of the target, etc.). In an embodiment, the design variables include a plurality of characteristics/parameters of the target. In an embodiment, the design variables can include any adjustable parameters of the substrate measurement recipe. For example, the design variables $(z_1, z_2, \ldots, z_N)$ may include wavelength, polarization, and/or pupil shape specified in the substrate measurement recipe.

As noted above, the $f_p(z_1, z_2, \ldots, z_N)$ may be affected by optical aberration of the lithography apparatus used to produce the target with the substrate measurement recipe (which optical aberration also affects the production of the pattern of the functional device). Thus, in an embodiment, optical aberration information for a lithograph apparatus used to pattern the device and target is used.

Computation of the $f_p(z_1, z_2, \ldots, z_N)$ and hence the cost function taking into account the impact of the optical aberration can be difficult or computationally expensive, especially when the cost function is repeatedly computed during the optimization or when the cost function represents multiple $f_p(z_1, z_2, \ldots, z_N)$ affected by the optical aberration. So, the optical aberration may be decomposed into multiple components. For example, the optical aberration may be decomposed into multiple Zernike coefficients (Z1, Z2, ..., Z20, ...). This decomposition process is called the Zernike transform. The basis functions of the Zernike transform are Zernike polynomials. Not every component of the optical aberration has equal impact on the $f_p(z_1, z_2, \ldots, z_N)$. So, only a subset of the components of the optical aberration may be selected to approximate the $f_p(z_1, z_2, \ldots, z_N)$. Namely, only the impact of these one or more selected components on the $f_p(z_1, z_2, \ldots, z_N)$ are taken into account when computing an approximate $f_p^*(z_1, z_2, \ldots, z_N)$ of the $f_p(z_1, z_2, \ldots, z_N)$. The cost function may be then approximated using the $f_p^*(z_1, z_2, \ldots, z_N)$ instead of the $f_p(z_1, z_2, \ldots, z_N)$. For example, the cost function in Eq. 1 can be approximated as $CF^*(z_1, z_2, \ldots, z_N) = \sum_{p=1}^{P} w_p (f_p^*(z_1, z_2, \ldots, z_N))^2$. The one or more selected components of the optical aberration may be those that have greater impact on the $f_p(z_1, z_2, \ldots, z_N)$ than one or more of the other components. Thus, in an embodiment, a threshold can be applied to the components of the optical aberration to select a subset of the components that cross the threshold, wherein the one or more components that cross the threshold have a greater impact on $f_p(z_1, z_2, \ldots, z_N)$ than one or more other components. So, in an embodiment, only the key Zernike terms are used in the cost function. Such feed-forwarding allows, e.g., runtime reduction. Because the optimization of the target and/or substrate measurement recipe may not involve optimization of the process of producing the target or the pattern of the functional device, the components of the optical aberration are not among the design variables ($z_1, z_2, \ldots, z_N$).

In an embodiment, multiple sets of initial values of design variables ("seeds") can be introduced and evaluated/optimized. For example, there can be less than or equal to 500, less than or equal 200, less than or equal to 100 seeds, or less than or equal to 50 seeds.

The optimization may be repeated by starting with different seeds. The initial values may be random (the Monte Carlo method), or may be supplied by a user. The seeds may be evenly spaced in a value space spanned by the design variables. Starting the optimization with different seeds reduces the chance of being trapped to a local extremum.

Further, to take advantage of parallel computation, multiple different seeds can be introduced and evaluated/optimized independently to increase the chance of finding an optimum. Thus, multiples seeds can be used derive respective optimums, from which best candidates can be chosen.

In an embodiment, different seeds of target design variables can be provided for a particular substrate measurement recipe and multiple substrate measurement recipes can be optimized each using multiple seeds of target design variables to arrive at an optimum combination of target design and substrate measurement recipe.

In an embodiment, there can be almost no performance requirements for the target design variables of the seeds in an initial pool. The optimization process will optimize the target design automatically regardless of the initial target design variable values.

The design variables may have constraints, which can be expressed as $(z_1, z_2, \ldots, z_N) \in Z$, where $Z$ is a set of possible values of the design variables. The constraints can be, for example, on one or more geometric characteristics of the target design (e.g., one or more design rules that specify that a particular geometric feature of the final target design must fall within a boundary set by an applicable process design rule) and/or, for example, a dimension requirement set by a measurement apparatus used to measure the target with the measurement recipe. Further, in an embodiment, a penalty function is introduced to automatically limit the cost function within a desired range of the one or more metrics. For example, one possible constraint on the design variables may be that the performance (e.g., detectability, printability, sensitivity, stability) associated with measurement of the target design using its associated recipe may not, or must, cross an associated threshold. Without such a constraint, the optimization may yield a target design and/or substrate measurement recipe that yields too weak a signal or that is too unstable. In an embodiment, the penalty function comprises a constraint on a characteristic of the target (e.g., a geometric characteristic of the target). For example, it could constrain stack sensitivity to, for example, between 0.2 and 0.8. In an embodiment, a penalty function for stack sensitivity can be, or comprise, the form of: $P(x)=c*((\max(0,0.2-x))^2+(\max(0,x-0.8))^2)$, wherein $c$ is a constant and the values 0.2 and 0.8 can be different. However, the usefulness of constraints and the penalty function should not be interpreted them as being a necessity.

The optimization process therefore is to find a set of values of the one or more design variables, under the optional constraints $(z_1, z_2, \ldots, z_N) \in Z$ and subject to an optional penalty function, that optimize the cost function, e.g., to find:

$$(\tilde{z}_1, \tilde{z}_2, \ldots, \tilde{z}_N) = \mathrm{argmin}_{(z_1, z_2, \ldots, z_N) \in Z} CF(z_1, z_2, \ldots, z_N) \quad \text{(Eq. 2)}$$

Figure 6:
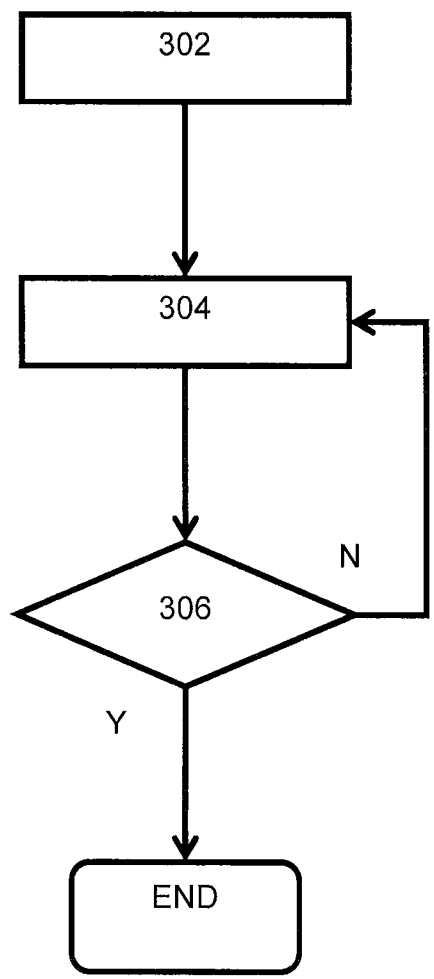
FIG. 6 is a flow diagram illustrating aspects of an example methodology of joint optimization/co-optimization.

A general method of optimizing, according to an embodiment, is illustrated in FIG. 6. This method comprises a step 302 of defining a multi-variable cost function of a plurality of design variables as discussed above. For example, in an embodiment, the design variables comprise one or more characteristics/parameters of the target design. In step 304, the design variables are simultaneously adjusted so that the cost function is moved towards convergence. In step 306, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step 306 is satisfied, the method ends. If the one or more conditions in step 306 is not satisfied, the steps 304 and 306 are iteratively repeated until a desired result is obtained. The optimization does not necessarily lead to a single set of values for the one or more design variables because there may be a physical restraint. The optimization may provide multiple sets of values for the one or more design variables and allows a user to pick one or more sets.

The design variables can be adjusted alternately (referred to as Alternate Optimization) or adjusted simultaneously (referred to as Simultaneous Optimization). The terms "simultaneous", "simultaneously", "joint" and "jointly" as used herein mean that the design variables are allowed to change at the same time. The term "alternate" and "alternately" as used herein mean that not all of the design variables are allowed to change at the same time.

Figure 7:
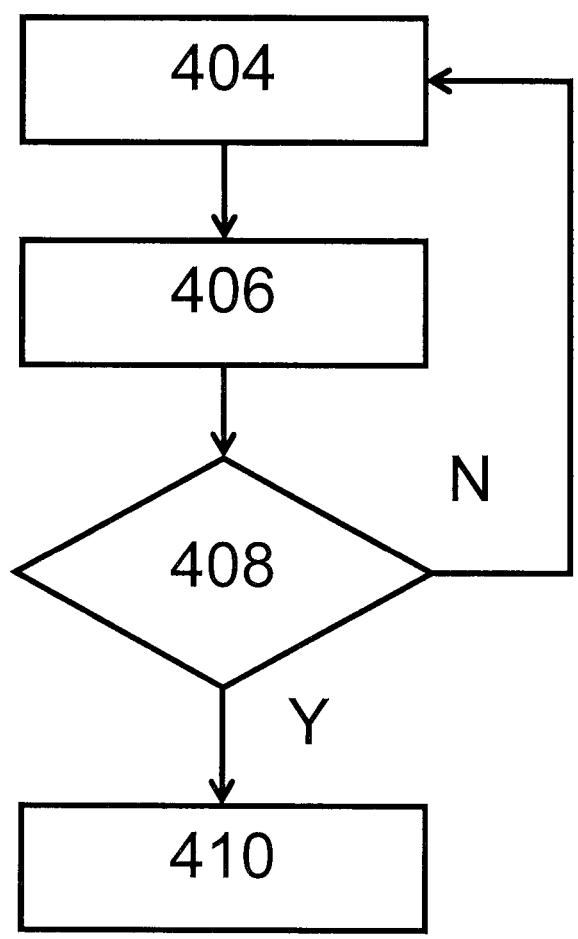
FIG. 7 shows an embodiment of a further optimization method, according to an embodiment.

In FIG. 6, the optimization of all the design variables is executed simultaneously. Such a flow may be called simultaneous flow or co-optimization flow. Alternately, the optimization of all the design variables is executed alternately, as illustrated in FIG. 7. In this flow, in each step, some design variables are fixed while other design variables are optimized to optimize the cost function; then in the next step, a different set of variables are fixed while the others are optimized to minimize or maximize the cost function. These steps are executed alternately until convergence or a certain terminating condition is met. As shown in the non-limiting example flowchart of FIG. 7, in step 404, where a first group of design variables (e.g., one or more parameters of the target design) are adjusted to minimize or maximize the cost function while a second group of design variables (e.g., one or more other parameters of the target or one more parameters of the measurement) are fixed. Then in the next step 406, the second group of the design variables is adjusted to minimize or maximize the cost function while the first group of design variables are fixed. These two steps are executed alternately, until a certain terminating condition is met in step 408. One or more various termination conditions can be used, such as the value of the cost function becomes equal to a threshold value, the value of the cost function crosses the threshold value, the value of the cost function reaches within a preset error limit, a preset number of iterations is reached, etc. Finally the output of the optimization result is obtained in step 410, and the process stops.

So, in an embodiment, an optimization technique is used to automatically arrive at a target design by starting with a small number of seed target designs in order to achieve one or more final target designs with an optimized performance indicator(s) (e.g., a metric such as device matching optionally in combination with one or more other metrics such as detectability, printability, etc.) and/or performance indicator(s) stability (e.g., stability, in view of variation, of a metric such as device matching optionally in combination with one or more other metrics such as detectability, printability, etc.). In an embodiment, one or more seed target designs are initially either manually selected or automatically generated (e.g., target designs with different pitch in different pitch increments). As discussed above, a cost function is introduced as the object to be optimized. The cost function can be in terms of a certain performance indicator itself, or an expression containing several performance indicators. The purpose of the cost function is to quantify the performance and/or stability, in response to change, of the target design mathematically. The optimization technique then automatically optimizes the cost function by modifying one or more target design parameters (e.g., geometrical characteristics) and re-evaluating the cost function, until a termination condition is reached (e.g., a limited number of iterations or until convergence, whichever comes first). In an embodiment, a penalty function is introduced to automatically limit the cost function within a desired range of the one or more performance indicators. In an embodiment, the optimization takes into account one or more design rules e.g., one or more rules that specify that a particular geometric feature of the final target design must fall within a boundary set by an applicable process design rule and/or a dimension requirement set by a measurement apparatus. The result is, for example, one or more target designs that are optimized in terms of the one or more performance indicators. Additionally, one or more substrate measurement recipes may be provided that are optimized with the one or more target designs and optimized in terms of the one or more performance indicators.

In an embodiment, examples of performance indicators include target coefficient (TC), stack sensitivity (SS), overlay impact (OV), or the like. Stack sensitivity can be understood as a measurement of how much the intensity of the signal changes as overlay changes because of diffraction between target (e.g., grating) layers. It is thus an example measure of sensitivity of the measurement. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Thus, target coefficient is an example measure of detectability. Overlay impact measures the change in overlay error as a function of target design. Thus, overlay impact is an example measure of sensitivity.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

$(n=1, 2, \ldots N)$ exist). An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

In an embodiment, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p (f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n - z_{ni}))^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = 0,$$

wherein $n=1, 2, \ldots, N$.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for $j=1, 2, \ldots, J$; and K equalities (e.g. interdependence between the design variables) $\sum_{n=1}^{N} C_{nk} z_n \leq D_k$, for $k=1, 2, \ldots, K$, the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} \Delta_D$. $(x_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press). One example of the constraints is that the design variables should not have values that cause the target to have detectability below a threshold.

Instead of minimizing the RMS of $f_p(z_1, z_2, \ldots, z_N)$, the optimization process can minimize magnitude of the largest deviation (the worst defect) among the characteristics to their intended values. In this approach, the cost function can alternatively be expressed as:

$$CF(z_1, z_2, \ldots, z_N) = \max_{1 \leq p \leq P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the characteristics. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \quad \text{(Eq. 6)}$$

wherein q is an even positive integer such as at least 4, or at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} z_n \leq \quad \text{(Eq. 6')}$$

$$E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} - f_p(z_{1i}, z_{2i}, \ldots, z_{Ni})$$

and $$-\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} z_n \leq \quad \text{(Eq. 6'')}$$

$$-E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} + f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1 - \lambda) \sum_{p=1}^{P} w_p f_p^2(z_1, z_2, \ldots, z_N) + \quad \text{(Eq. 6''')}$$

$$\lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Thus, in an embodiment, there is provided an automatic metrology target performance indicator optimization using an optimization technique to identify one or more target designs and/or substrate measurement recipes that are optimum in view of one or more performance indicators and/or optimum in terms of stability of the one or more performance indicators in response to change of the target (e.g., due to process variation). In an embodiment, the performance indicator comprises a matching to a device pattern. In an embodiment, one or more final target designs are obtained through target geometry optimization in respect of the one or more performance indicators. In an embodiment, the performance indicators are device pattern matching and detectability performance and are automatically optimized together (e.g., co-optimized). In an embodiment, the performance indicator is automatically limited within a desired region (e.g., by a penalty function). In an embodiment, a dimension of optimized target design is automatically limited to comply with a design rule. In an embodiment, the technique enables reducing the number of simulation iterations. In an embodiment, a simulation with several different step sizes of geometric parameters of the target designs are launched simultaneously for each iteration and the best results are combined to be a base for a next iteration. In this way, many iteration steps can be eliminated leading to much faster optimization. So, in an embodiment, the approach herein can find a target design with much better device patterning matching performance than what can be achieved by using standard target and brute force searching. In an embodiment, the optimization process explores an almost unlimited target design space, wherein the target design space is only limited by any applicable design rule. Thus, in an embodiment, the optimization process can less computational resources and/or require less simulation time.

Figure 8:
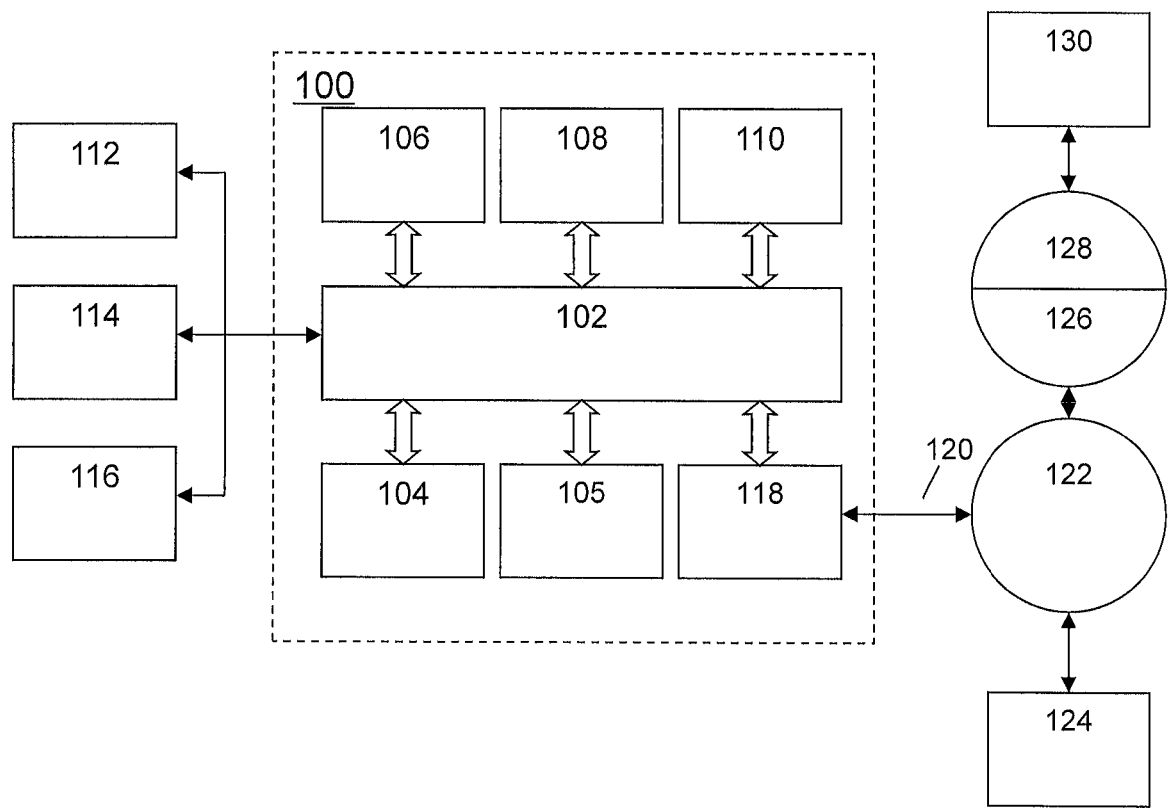
FIG. 8 is a block diagram of an example computer system.

FIG. 8 is a block diagram that illustrates a computer system 100 which can assist in implementing one or more of methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, may be coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for execution of a process as described herein, for example. The received code may be executed by processor 104 as it is received, and/or stored in storage device 110, or other non-volatile storage for later execution. In this manner, computer system 100 may obtain application code in the form of a carrier wave.

Figure 9:
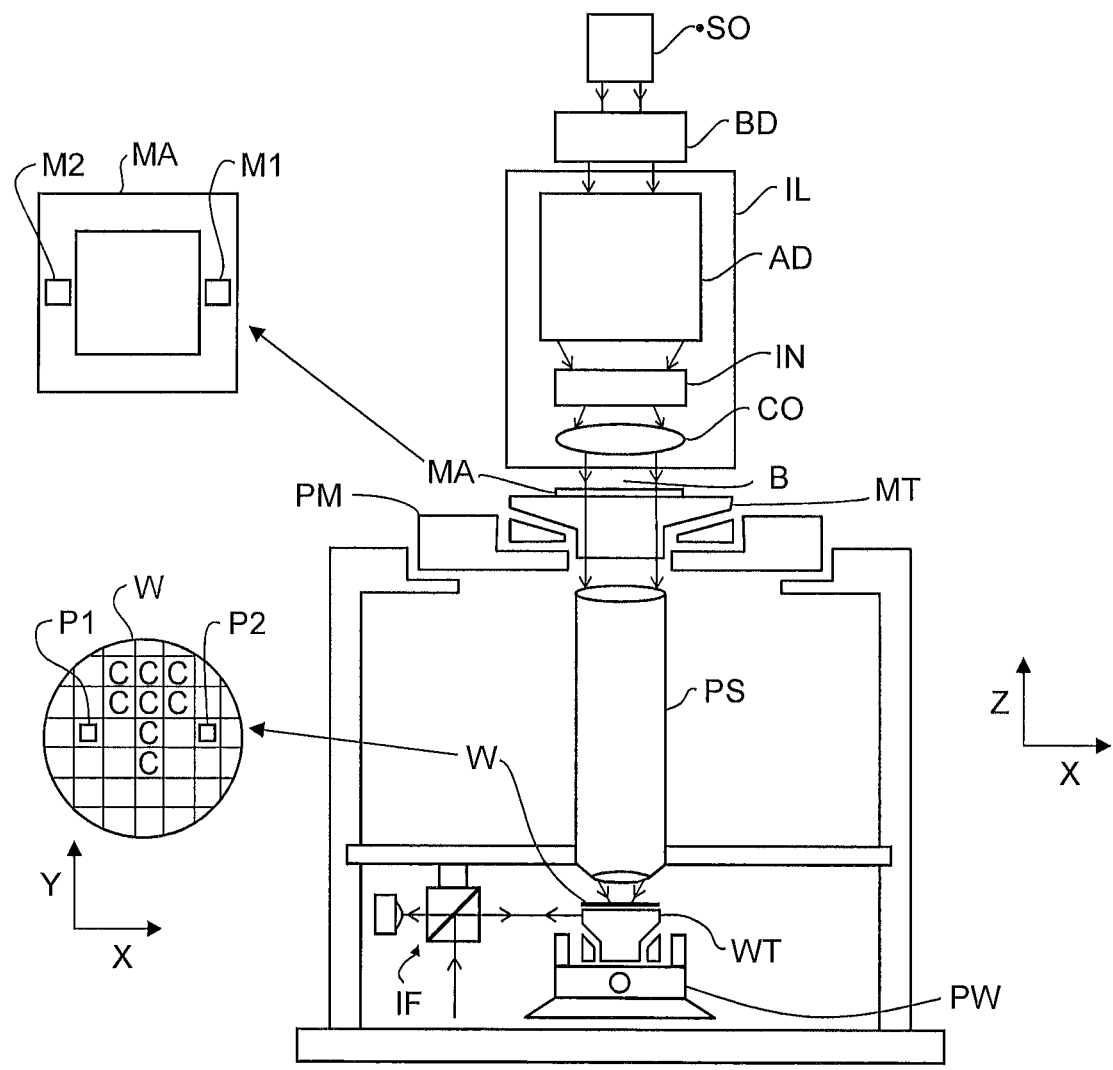
FIG. 9 is a schematic diagram of a lithography apparatus.

FIG. 9 schematically depicts an exemplary lithography apparatus. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 9 that the source SO may be within the housing of the lithography apparatus (as is often the case when the source SO is a mercury lamp, for example), but that it may also be remote from the lithography apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 10:
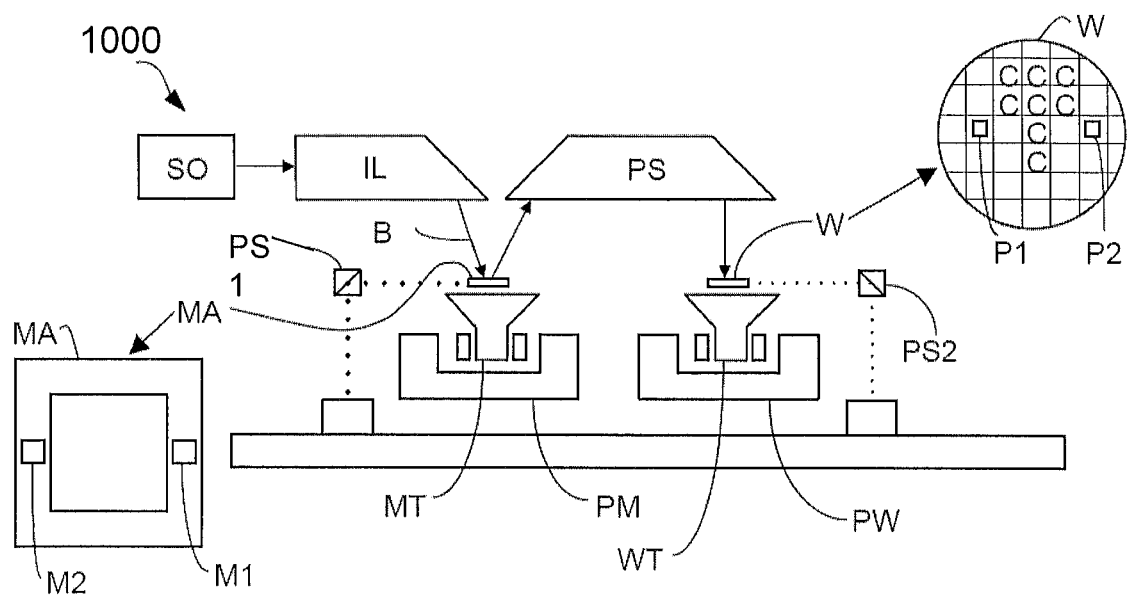
FIG. 10 is a schematic diagram of another lithography apparatus.

FIG. 10 schematically depicts another exemplary lithography apparatus 1000. The lithography apparatus 1000 comprises:
- a source collector module SO;
- an illumination system (illuminator) IL configured to condition a radiation beam B (e.g. EUV radiation);
- a support structure (e.g. a patterning device table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 10, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 10, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithography apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as CS-outer and σ-inner, respectively) of the intensity distribution in a pupil plane of the illuminator can be adjusted. In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
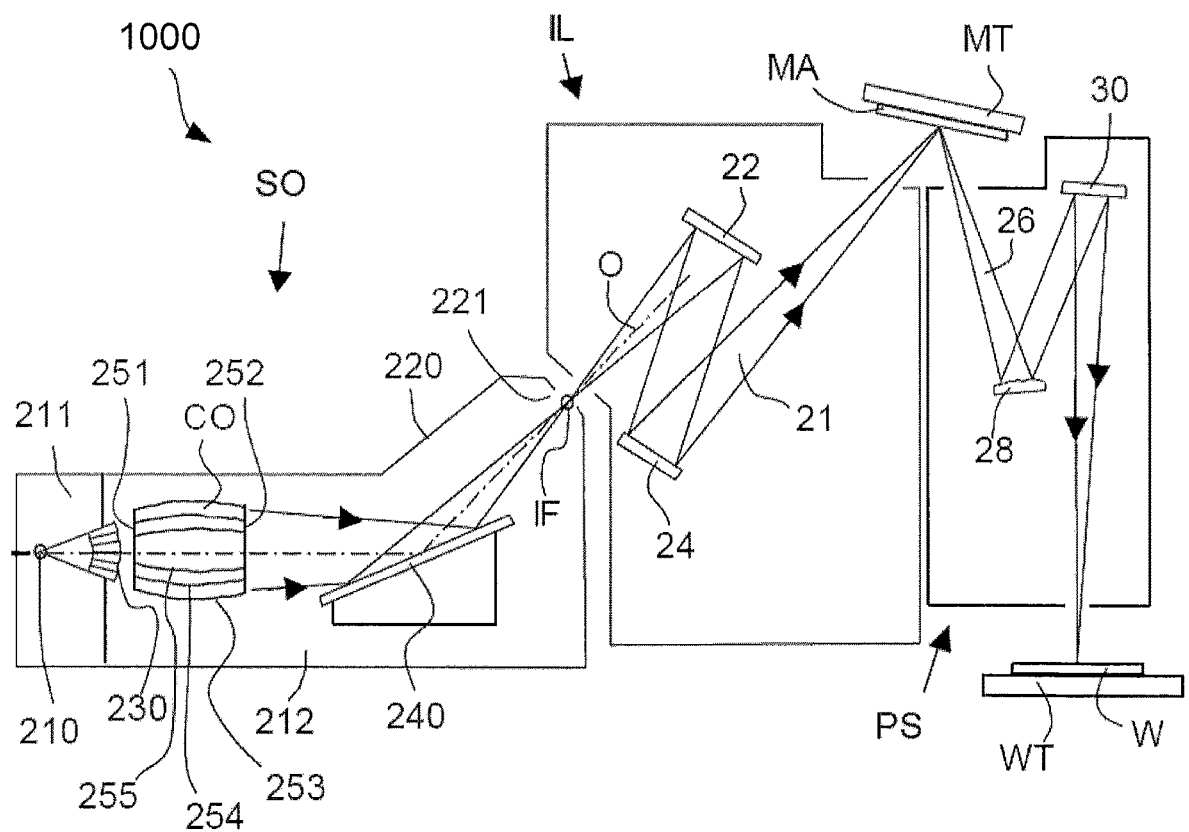
FIG. 11 is a more detailed view of the apparatus in FIG. 10.

FIG. 11 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211.

The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithography apparatus. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 12:
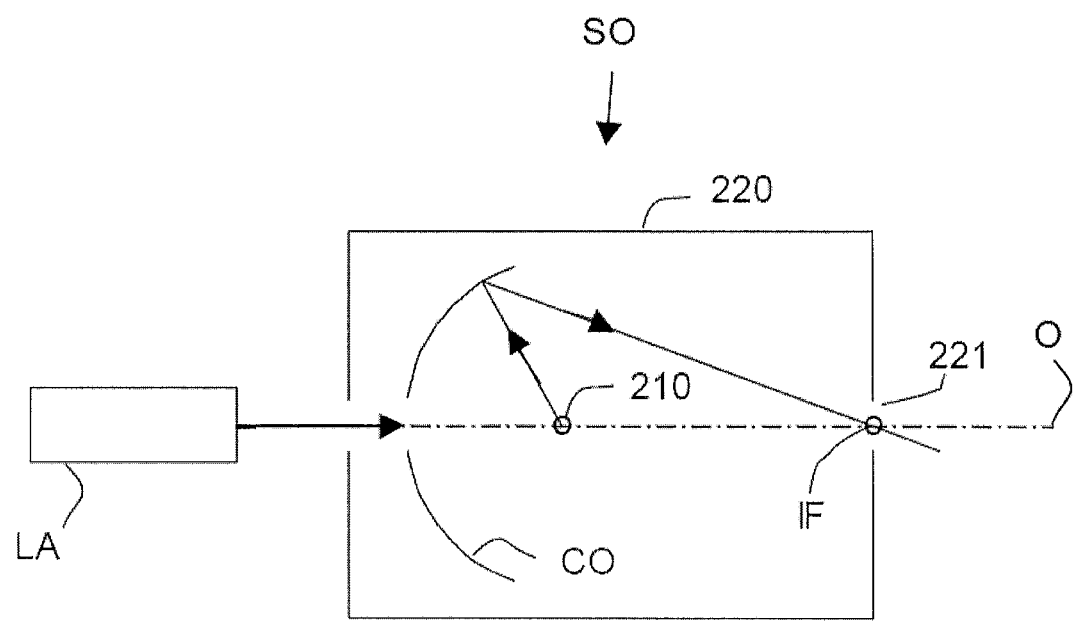
FIG. 12 is a more detailed view of the source collector module SO of the apparatus of FIG. 10 and FIG. 11.

Alternatively, the source collector module SO may be part of an LPP radiation system as shown in FIG. 12. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method comprising:
computing, by a hardware computer system, a multi-variable cost function, the multi-variable cost function representing a metric characterizing a degree of matching between a result when measuring a metrology target structure using a substrate measurement recipe and a behavior of a pattern of a functional device, the metric being a function of a plurality of design variables comprising a parameter of the metrology target structure; and
adjusting one or more of the design variables and computing the cost function with the one or more adjusted design variables, until a certain termination condition is satisfied.
2. The method of clause 1, wherein the result when measuring the metrology target structure using the substrate measurement recipe comprises overlay, alignment or focus.
3. The method of clause 1 or clause 2, wherein computing the multi-variable cost function comprises simulating the result of measuring the metrology target structure using the substrate measurement recipe.
4. The method of clause 3, wherein simulating the result comprises determining, from a parameter of the substrate measurement recipe, a characteristic of radiation used to measure the metrology target structure using the substrate measurement recipe.
5. The method of clause 4, wherein simulating the result comprises determining, from the parameter of the metrology target structure, an interaction between the radiation and the metrology target structure.
6. The method of any of clauses 1 to 5, wherein the metric is a difference between the result and the behavior.
7. The method of any of clauses 1 to 6, wherein the cost function further represents a performance of the measurement of the metrology target structure when using the substrate measurement recipe.
8. The method of clause 7, wherein the performance comprises detectability of the metrology target structure associated with the substrate measurement recipe, printability of a measurement target structure associated with the substrate measurement recipe, sensitivity of measurements made using the substrate measurement recipe, stability of measurements made using the substrate measurement recipe, or a combination selected therefrom.
9. The method of clause 7 or clause 8, wherein one or more of the design variables are under a constraint that the performance either crosses or does not cross, a threshold.
10. The method of any of clauses 1 to 9, wherein the termination condition comprises one or more selected from: minimization of the cost function; maximization of the cost function; reaching a certain number of iterations; reaching a value of the cost function equal to or beyond a certain threshold value; reaching a certain computation time; and/or reaching a value of the cost function within an acceptable error limit.
11. The method of any of clauses 1 to 10, wherein the design variables are adjusted by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.
12. A computer program product comprising a non-transitory computer readable medium having instructions recorded thereon, the instructions when executed by a computer system implementing the method of any of clauses 1 to 11.

The concepts disclosed herein may be used with any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
computing, by a hardware computer system, a multi-variable cost function, the multi-variable cost function representing a metric characterizing a degree of matching between a result when measuring a metrology target structure separate from a pattern of a functional device using a substrate measurement recipe and a behavior of the pattern of the functional device, the metric being a function of a plurality of design variables comprising a parameter of the metrology target structure; and
adjusting one or more of the design variables and computing the cost function with the one or more adjusted design variables, until a certain termination condition is satisfied.
2. The method of claim 1, wherein the result when measuring the metrology target structure using the substrate measurement recipe comprises overlay, alignment or focus.
3. The method of claim 1, wherein computing the multi-variable cost function comprises simulating the result of measuring the metrology target structure using the substrate measurement recipe.
4. The method of claim 3, wherein simulating the result comprises determining, from a parameter of the substrate measurement recipe, a characteristic of radiation used to measure the metrology target structure using the substrate measurement recipe.

5. The method of claim 4, wherein simulating the result comprises determining, from the parameter of the metrology target structure, an interaction between the radiation and the metrology target structure.

6. The method of claim 1, wherein the metric is a difference between the result and the behavior.

7. The method of claim 1, wherein the cost function further represents a performance of the measurement of the metrology target structure when using the substrate measurement recipe.

8. The method of claim 7, wherein the performance comprises detectability of the metrology target structure associated with the substrate measurement recipe, printability of a measurement target structure associated with the substrate measurement recipe, sensitivity of measurements made using the substrate measurement recipe, stability of measurements made using the substrate measurement recipe, or a combination selected therefrom.

9. The method of claim 7, wherein one or more of the design variables are under a constraint that the performance either crosses or does not cross, a threshold.

10. The method of claim 1, further comprising producing electronic data configured to enable configuration of a setting of a metrology apparatus according to one or more of the adjusted one or more design variables at the termination condition and/or to enable production of a metrology target according to one or more of the adjusted one or more design variables at the termination condition.

11. A computer program product comprising a non-transitory computer readable medium having instructions therein, the instructions, upon execution by a computer system, configured to cause the computer system to at least:
compute a multi-variable cost function, the multi-variable cost function representing a metric characterizing a degree of matching between a result when measuring a metrology target structure separate from a pattern of a functional device using a substrate measurement recipe and a behavior of the pattern of the functional device, the metric being a function of a plurality of design variables comprising a parameter of the metrology target structure; and
adjust one or more of the design variables and computing the cost function with the one or more adjusted design variables, until a certain termination condition is satisfied.

12. The computer program product of claim 11, wherein the result when measuring the metrology target structure using the substrate measurement recipe comprises overlay, alignment or focus.

13. The computer program product of claim 11, wherein the instructions configured to compute the multi-variable cost function are further configured to simulate the result of measuring the metrology target structure using the substrate measurement recipe.

14. The computer program product of claim 11, wherein the instructions configured to simulate the result are further configured to determine, from a parameter of the substrate measurement recipe, a characteristic of radiation used to measure the metrology target structure using the substrate measurement recipe.

15. The computer program product of claim 14, wherein the instructions configured to simulate the result are further configured to determine, from the parameter of the metrology target structure, an interaction between the radiation and the metrology target structure.

16. The computer program product of claim 11, wherein the metric is a difference between the result and the behavior.

17. The computer program product of claim 11, wherein the cost function further represents a performance of the measurement of the metrology target structure when using the substrate measurement recipe.

18. The computer program product of claim 17, wherein the performance comprises detectability of the metrology target structure associated with the substrate measurement recipe, printability of a measurement target structure associated with the substrate measurement recipe, sensitivity of measurements made using the substrate measurement recipe, stability of measurements made using the substrate measurement recipe, or a combination selected therefrom.

19. The computer program product of claim 17, wherein one or more of the design variables are under a constraint that the performance either crosses or does not cross, a threshold.

20. The computer program product of claim 11, wherein the instructions are further configured to cause the computer system to produce electronic data configured to enable configuration of a setting of a metrology apparatus according to one or more of the adjusted one or more design variables at the termination condition and/or to enable production of a metrology target according to one or more of the adjusted one or more design variables at the termination condition.

* * * * *